(12) United States Patent
Choi et al.

(10) Patent No.: US 11,309,002 B2
(45) Date of Patent: Apr. 19, 2022

(54) DELAY LOCKED LOOP CIRCUIT AND SEMICONDUCTOR MEMORY DEVICE HAVING THE SAME

(71) Applicant: Samsung Electronics Co., Ltd., Suwon-si (KR)

(72) Inventors: Hundae Choi, Hwaseong-si (KR); Garam Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/109,567

(22) Filed: Dec. 2, 2020

(65) Prior Publication Data

US 2021/0335403 A1 Oct. 28, 2021

(30) Foreign Application Priority Data

Apr. 22, 2020 (KR) .......................... 10-2020-0048631

(51) Int. Cl.
| | |
|---|---|
| *G11C 7/22* | (2006.01) |
| *H03L 7/081* | (2006.01) |
| *H03L 7/085* | (2006.01) |
| *G11C 8/10* | (2006.01) |
| *G11C 7/10* | (2006.01) |

(52) U.S. Cl.
CPC ............ *G11C 7/222* (2013.01); *G11C 7/1057* (2013.01); *G11C 7/22* (2013.01); *G11C 7/225* (2013.01); *G11C 7/227* (2013.01); *G11C 8/10* (2013.01); *H03L 7/085* (2013.01); *H03L 7/0816* (2013.01); *G11C 2207/2272* (2013.01); *G11C 2207/2281* (2013.01)

(58) Field of Classification Search
CPC ......... H03L 7/0816; H03L 7/085; G11C 7/22; G11C 7/222; G11C 7/225; G11C 7/227; G11C 7/1057; G11C 2207/2272; G11C 2207/2281; G11C 8/10
USPC ........................... 365/189.15, 233.1, 233.12
See application file for complete search history.

(56) References Cited

U.S. PATENT DOCUMENTS

| | | |
|---|---|---|
| 6,917,229 B2 | 7/2005 | Cho |
| 8,085,072 B2 | 12/2011 | Lee et al. |
| 8,269,534 B2 | 9/2012 | Kim |
| 8,294,499 B2 | 10/2012 | Kwon et al. |
| 8,917,130 B2 | 12/2014 | Fujimaki |
| 9,397,671 B2 | 7/2016 | Kim |
| 10,291,240 B2 * | 5/2019 | Im .......................... G11C 7/222 |
| 10,297,298 B2 | 5/2019 | Polney |

(Continued)

*Primary Examiner* — Son L Mai

(74) *Attorney, Agent, or Firm* — Harness, Dickey & Pierce, P.L.C.

(57) ABSTRACT

A delay locked loop circuit and a semiconductor memory device are provided. The delay locked loop circuit includes a phase detection and delay control circuit configured to detect a phase difference between a first internally generated clock signal the feedback clock signal to generate a first phase difference detection signal in response to a first selection signal being activated, to detect a phase difference between a second internally generated clock signal and the feedback clock signal to generate a second phase difference detection signal in response to a second selection signal being activated, and to change a code value in response to the first phase difference detection signal or the second phase difference detection signal.

20 Claims, 12 Drawing Sheets

(56) References Cited

U.S. PATENT DOCUMENTS

2005/0141334 A1 6/2005 Jeong
2010/0226188 A1 9/2010 Kim et al.

* cited by examiner

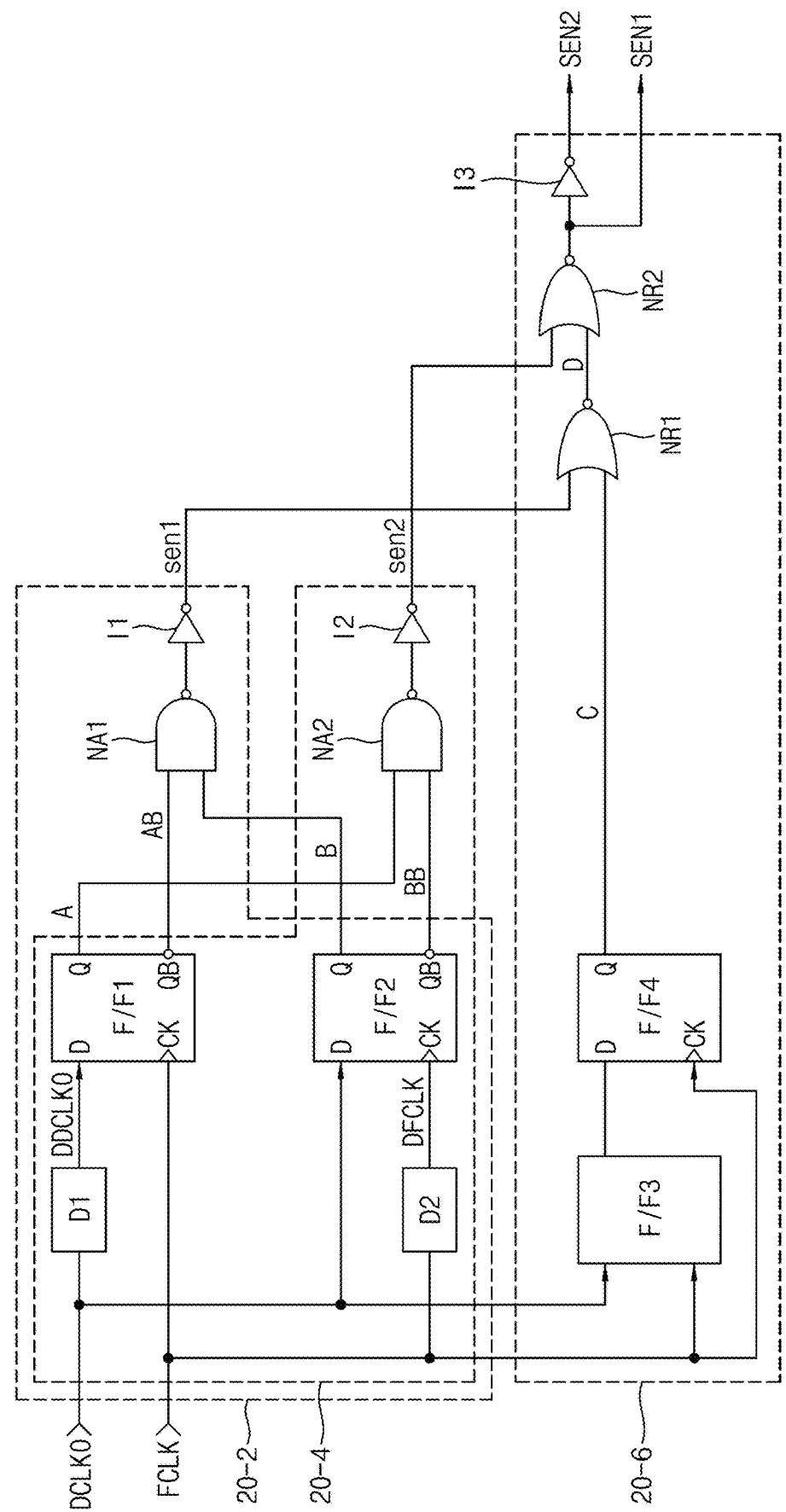

DELAY LOCKED LOOP CIRCUIT AND SEMICONDUCTOR MEMORY DEVICE HAVING THE SAME

CROSS-REFERENCE TO THE RELATED APPLICATION

This application claims priority from Korean Patent Application No. 10-2020-0048631, filed on Apr. 22, 2020, in the Korean Intellectual Property Office, the disclosure of which is incorporated herein by reference in its entirety.

BACKGROUND

Some example embodiments of inventive concepts relate to a delay locked loop circuit and/or a semiconductor memory device having the same.

A delay locked loop (DLL) circuit may be configured to generate an output clock signal locked/aligned to a phase of an input clock signal.

Generally, the delay locked loop circuit may include a variable delay circuit/circuitry including delay cells configured to delay variably a reference clock signal generated by buffering the input clock signal according to a code value, and to generate a delayed clock signal, and a phase difference detector configured to detect a phase difference between the reference clock signal and a feedback clock signal generated by replicating a path which is from the delayed clock signal until the output clock signal is output and generate the code value.

However, when the delay locked loop circuit performs a delay locked operation generating the output clock signal locked to the input clock signal using the reference clock signal obtained by dividing the input clock signal, or locked to the input clock signal in which a duty ratio is not 50%, the delay locked loop circuit generates the output clock signal locked to the input clock signal by delaying one clock cycle above, or, alternatively, e.g. at the worst case, up to two clock cycles from the input clock signal after the phase difference is detected. For example, a locking time of the delay locked loop circuit may exceed one clock cycle of the input clock signal.

SUMMARY

Some example embodiments of inventive concepts provide a delay locked loop circuit capable of reducing a locking time, and/or a semiconductor memory device having the same.

Objects of example embodiments of inventive concepts are not limited to the aforementioned object, and other unmentioned objects will be clearly understood by those of ordinary skill in the art based on the following description of inventive concepts.

According to some example embodiments of inventive concepts, a delay locked loop circuit includes a first selector circuit configured to generate a first internally generated clock signal as a first reference clock signal as the first reference clock signal in response to a first selection signal, and to generate a second internally generated clock signal as the first reference clock signal in response to a second selection signal, a first delay circuit configured to delay the first reference clock signal by a first time according to a code value to generate a first clock signal, a second delay circuit configured to generate a second clock signal by delaying the first internally generated clock signal by the first time according to the code value, a clock signal delay path circuit configured to delay the first clock signal by a second time to generate an output clock signal, a clock signal delay replica circuit configured to delay the second clock signal by the second time to generate a feedback clock signal, a selection signal generator circuit configured to activate the first selection signal in response to a first edge of the feedback clock signal being present within a first period including a third time before and after the first edge of the first internally generated clock signal, and to activate the second selection signal in response to the first edge of the feedback clock signal being present within a second period including the third time before and after a second edge of the first internally generated clock signal, and a phase detection and delay control circuit configured to detect a phase difference between the feedback clock signal and the first internally generated clock signal to generate a first phase difference detection signal in response to the first selection signal being activated, to detect a phase difference between the feedback clock signal and the second internally generated clock signal to generate a second phase difference detection signal in response to the second selection signal being activated, and to change the code value in response to the first phase difference detection signal or the second phase difference detection signal.

According to some example embodiments of inventive concept, a delay locked loop circuit include a divider circuit configured to divide an input clock signal to generate a first divided clock signal, to generate a second divided clock signal having an inverted phase of the first divided clock signal, to generate a third divided clock signal having 90-degree phase difference with the first divided clock signal, and to generate a fourth divided clock signal having an inverted phase of the third divided clock signal, a first selector circuit configured to generate the first divided clock signal as a first reference clock signal in response to the first selection signal, and to generate the second divided clock signal as the first reference clock signal in response to the second selection signal, a second selector circuit configured to generate the third divided clock signal as a second reference clock signal in response to the first selection signal, and to generate the fourth divided clock signal as the second reference clock signal in response to the second selection signal, a first delay circuit configured to delay the first reference clock signal by a first time according to a code value to generate a first clock signal, a second delay circuit configured to delay the first divided clock signal by the first time according to the code value to generate a second clock signal, a third delay circuit configured to delay the second reference clock signal by the first time according to the code value to generate a third clock signal, a clock signal delay path circuit configured to delay the first clock signal and the third clock signal by a second time to generate an output clock signal, a clock signal delay replica circuit configured to delay the second clock signal by the second time to generate a feedback clock signal, a selection signal generator circuit configured to activate the first selection signal in response to a first edge of the feedback clock signal being present within a first period including a third time before and after the first edge of the first divided clock signal, and to activate the second selection signal in response to the first edge of the feedback clock signal being present within a second period including the third time before and after a second edge of the first divided clock signal, a first phase detector circuit configured to detect a phase difference between the first divided clock signal and the feedback clock signal to generate a first phase difference detection signal in response to the first selection signal being activated, a second phase detector circuit configured to detect a phase difference between the second divided clock signal and the feedback clock signal to generate a second phase difference detection signal in response to the second selection signal being activated, and a delay control circuit configured to change the code value in response the first phase difference detection signal or the second phase difference detection signal.

According to some example embodiments of the inventive concept, a semiconductor memory device includes a clock signal input buffer circuit configured to buffer and delay an external clock signal by a fourth time to generate an input clock signal, a delay locked loop circuit configured to (a) generate a first clock signal by delaying a first internally generated clock signal obtained by dividing or splitting the input clock signal by a first time according to a code value, in response to a first selection signal and by delaying a second internally generated clock signal obtained by dividing or splitting the input clock signal by the first time according to the code value, in response to a second selection signal, (b) generate a data strobe signal by delaying the first internally generated clock signal by a second time, (c) generate a second clock signal by delaying the first internally generated clock signal by the first time according to the code value, and (d) generate a feedback clock signal locked to the first internally generated clock signal by delaying the second clock signal by an amount corresponding to the fourth time+the second time, a row decoder circuit configured to decode a row address to generate a plurality of word line selection signals, a column decoder circuit configured to decode a column address to generate a plurality of column selection signals, a memory cell array including a plurality of memory cells, and configured to output data stored in memory cells selected from the plurality of memory cells by the plurality of word line selection signals and the plurality of column selection signals, a data read path circuit configured to input the data output from the memory cell array in response to a read command and a latency signal, and to generate the data in response to the first clock signal, and a data output buffer circuit configured to buffer the data to output buffered data to the outside.

BRIEF DESCRIPTION OF THE DRAWINGS

FIG. 2 is a diagram illustrating a configuration of a selection signal generator according to some example embodiments of inventive concepts.

DETAILED DESCRIPTION OF SOME EXAMPLE EMBODIMENTS

Hereinafter, a delay locked loop circuit and a semiconductor memory device having the same according to some example embodiments of inventive concept will be described with reference to the accompanying drawings.

Figure 1:
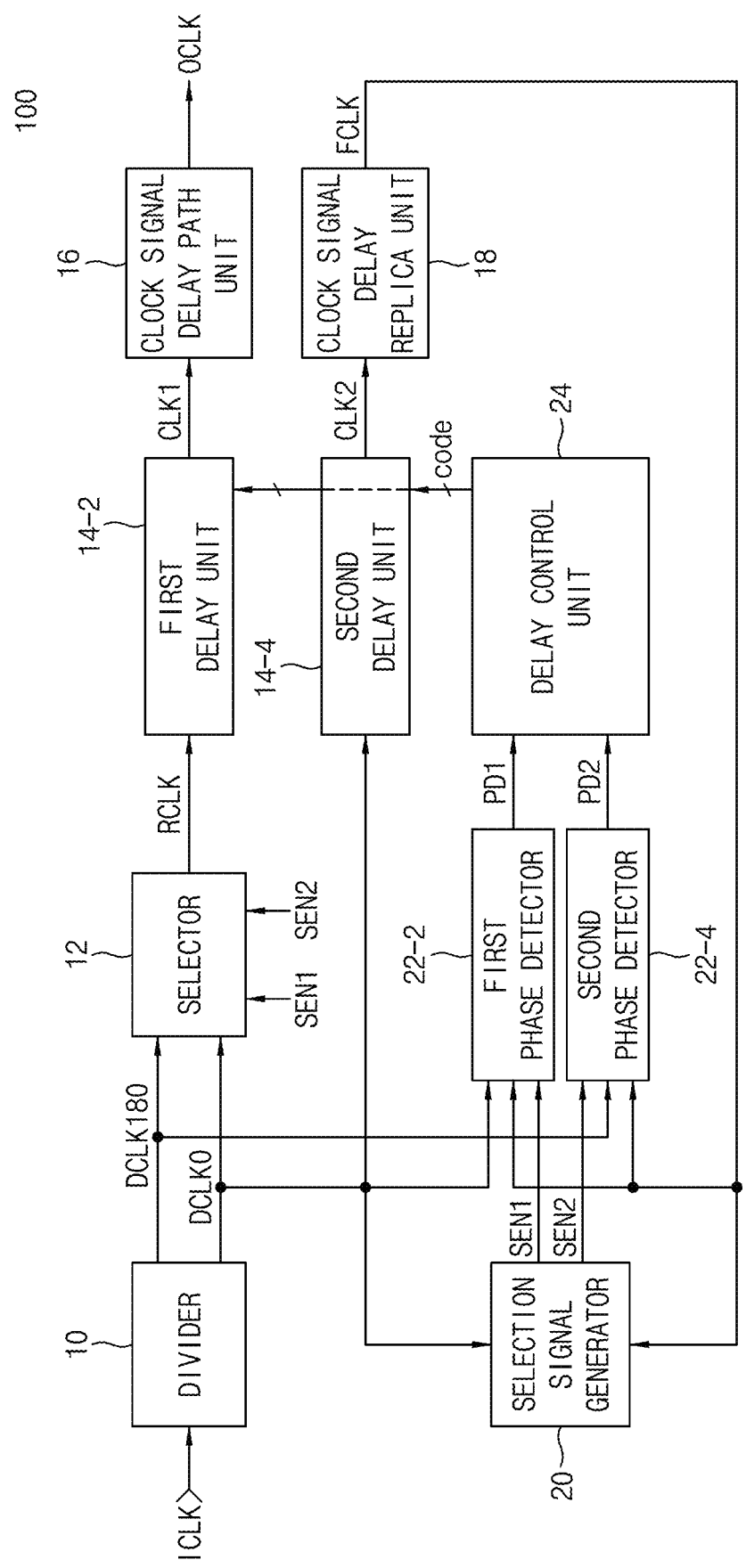
FIG. 1 is a block diagram illustrating a configuration of a delay locked loop circuit according to some example embodiments of inventive concepts.

FIG. 1 is a block diagram illustrating a configuration of a delay locked loop circuit according to some example embodiments of inventive concepts. The delay locked loop circuit 100 may include a divider 10, a selector 12, a first delay unit 14-2, a second delay unit 14-4, a clock signal delay path unit 16, a clock signal delay replica unit 18, a selection signal generator 20, a first phase detector 22-2, a second phase detector 22-4, and a delay control unit 24.

A function of each of the blocks/units/circuits shown in FIG. 1 will be described below.

The divider 10 may divide an input clock signal ICLK to generate a first divided clock signal DCLK0 and a second divided clock signals DCLK180.

The selector 12 may generate the first divided clock signal DCLK0 as a reference clock signal RCLK in response to a first selection signal SEN1, and generate the second divided clock signal DCLK180 as the reference clock signal RCLK in response to a second selection signal SEN2.

The first delay unit 14-2 may include a plurality of first delay cells (not shown) which are connected in series, and may variably delay the reference clock signal RCLK according to a code value code, so as to generate a first clock signal CLK1. The code value code may be or include a plurality of bits of digital data, and may be associated with an amount of delay. The first delay cells (not shown) may include transistors and/or resistors and/or capacitors to add a specific, e.g. a fixed delay.

The second delay unit 14-4 may include a plurality of second delay cells (not shown) which are connected in series, and may variably delay the first divided clock signal DCLK0 according to the code value code to generate a second clock signal CLK2. The second delay cells (not shown) may include transistors and/or resistors and/or capacitors to add a specific, e.g. a fixed delay. The number of the first delay cells (not shown) and the number of the second delay cells (not shown) may be the same, and the first delay unit 14-2 and the second delay unit 14-4 may delay the reference clock signal RCLK and the first divided clock signal DCLK0 by the same first time according to the code value code. As used herein, times such as "first time", "second time", "third time," "fourth time", etc. may be predetermined times, or alternatively, may be variable times that are not predetermined.

The clock signal delay path unit 16 may delay the first clock signal CLK1 by a second time to generate an output clock signal OCLK. For example, the clock signal delay path unit 16 may generate the output clock signal OCLK having the same frequency and the same phase (0 degree phase difference) as the input clock signal ICLK.

The clock signal delay replica unit 18 may delay the second clock signal CLK2 to generate a feedback clock signal FCLK. The clock signal delay replica unit 18 may be configured to delay the second clock signal CLK2 by the second time similar to the clock signal delay path unit 16. When there is a line delay time by a signal line till the first clock signal CLK1 output from the first delay unit 14-2 is applied to the clock signal delay path unit 16, the clock signal delay replica unit 18 may delay the second clock signal CLK2 by an amount of time equal to or corresponding to the second time+the line delay time, to generate the feedback clock signal FCLK. The feedback clock signal FCLK may have the same frequency as the first divided clock signal DCLK0.

The selection signal generator 20 may activate the first selection signal SEN1 when detecting that a rising edge of the feedback clock signal FCLK is present within a first period including a third time before and after a time point in which the first divided clock signal DCLK0 transits from a first, e.g. "low" level to a second, e.g. "high" level using the first divided clock signal DCLK0 and the feedback clock signal FCLK, and may activate the second selection signal SEN 2 when detecting that the rising edge of the feedback clock signal FCLK is present within a second period including the third time before and after a time point in which the first divided clock signal DCLK0 transits from the second/"high" level to the first/"low" level.

The first phase detector 22-2 may be enabled in response to the first selection signal SEN1, and may detect a phase difference between the first divided clock signal DCLK0 and the feedback clock signal FCLK to generate a first phase difference detection signal PD1.

The second phase detector 22-4 may be enabled in response to the second selection signal SEN2, and may detect a phase difference between the second divided clock signal DCLK180 and the feedback clock signal FCLK to generate a second phase difference detection signal PD2.

The delay control unit 24 may change, e.g. may increase or decrease the code value code in response to the first phase difference detection signal PD1 and/or the second phase difference detection signal PD2.

The first phase detector 22-2, the second phase detector 22-4, and the delay control unit 24 shown in FIG. 1 may configure a phase detection and delay control unit.

FIG. 2 is a diagram illustrating a configuration of the selection signal generator according to some example embodiments of inventive concepts. The selection signal generator 20 may include a first detector 20-2, a second detector 20-4, and a third detector 20-6. The first detector 20-2 may include first and second delayers D1, D2, first and second flip-flops F/F1, F/F2, a first NAND gate NA1, and a first inverter I1, the second detector 20-4 may include the first and second delayers D1, D2, the first and second flip-flops F/F1, F/F2, a second NAND gate NA2, and a second inverter I2, and the third detector 20-6 may include third and fourth flip-flops F/F3, F/F4, first and second NOR gates NR1, NR2, and a third inverter I3. The first and second delayers D1, D2 and the first and second flip-flops F/F1, F/F2 may be shared by the first detector 20-2 and the second detector 20-4. The first NAND gate NA1 and the first inverter I1 may be/include a first AND circuit, and the second NAND gate NA2 and the second inverter I2 may be/include a second AND circuit.

A function of each of the elements shown in FIG. 2 will be described below.

The first detector 20-2 may activate a first detection signal sen1 when the rising edge of the feedback clock signal FCLK is present within the first period including the third time before and after a time point in which the first divided clock signal DCLK0 transits from the "low" level to the "high" level. The third time may be/correspond to a period less than a "high" level period or a "low" level period of the first divided clock signal DCLK0.

The second detector 20-4 may activate a second detection signal sen2 when the rising edge of the feedback clock signal FCLK is present within the second period including the third time before and after a time point in which the first divided clock signal DCLK0 transits from the "high" level to the "low" level.

The third detector 20-6 may activate the first selection signal SEN1 in response to the first detection signal sen1, and activate the second selection signal SEN2 in response to the second detection signal sen2. Further, the third detector 20-6 may activate the first selection signal SEN1 when the rising edge of the feedback clock signal FCLK is present within a third period which is the "high" level period of the first divided clock signal DCLK0 except the first period and the second period, and activate the second selection signal SEN2 when the rising edge of the feedback clock signal FCLK is present within a fourth period which is the "low" level period of the first divided clock signal DCLK0 except the first period and the second period.

The first delayer D1 may delay the first divided clock signal DCLK0 by a third time to generate a delayed clock signal DDCLK0.

The first flip-flop F/F1 may latch the delay clock signal DDCLK0 to generate a first signal A and an inverted first signal AB having an inverted phase of the first signal A in response to a rising edge of the feedback clock signal FCLK.

The second delayer D2 may delay the feedback clock signal FCLK by the third time to generate a delayed feedback clock signal DFCLK.

The second flip-flop F/F2 may latch the first divided clock signal DCLK0 to generate the second signal B and an inverted second signal BB having an inverted phase of the second signal B in response to the rising edge of the delayed feedback clock signal DFCLK.

The first AND circuit (the first NAND gate NA1 and/in series with the first inverter I1) may perform an AND operation (logical AND) on the inverted first signal AB and the second signal B to generate the first detection signal sen1.

The second AND circuit (the second NAND gate NA2 and the second inverter I2) may perform an AND operation (logical AND) on the first signal A and the inverted second signal BB to generate the second detection signal sen2.

The third flip-flop F/F3 may latch and output the first divided clock signal DCLK0 in response to the rising edge of the feedback clock signal FCLK.

The fourth flip-flop F/F4 may latch an output signal of the third flip-flop F/F3 to generate a third signal C in response to the rising edge of the feedback clock signal FCLK.

The first NOR gate NR1 may perform a NOR operation (logical NOR) on the first detection signal sent and the third signal C to generate a fourth signal D.

The second NOR gate NR2 may perform a NOR operation (logical NOR) on the second detection signal sen2 and the fourth signal D to generate the first selection signal SEN1.

The third inverter I3 may invert (negate) the first selection signal SEN1 to generate the second selection signal SEN2.

Figure 3A:
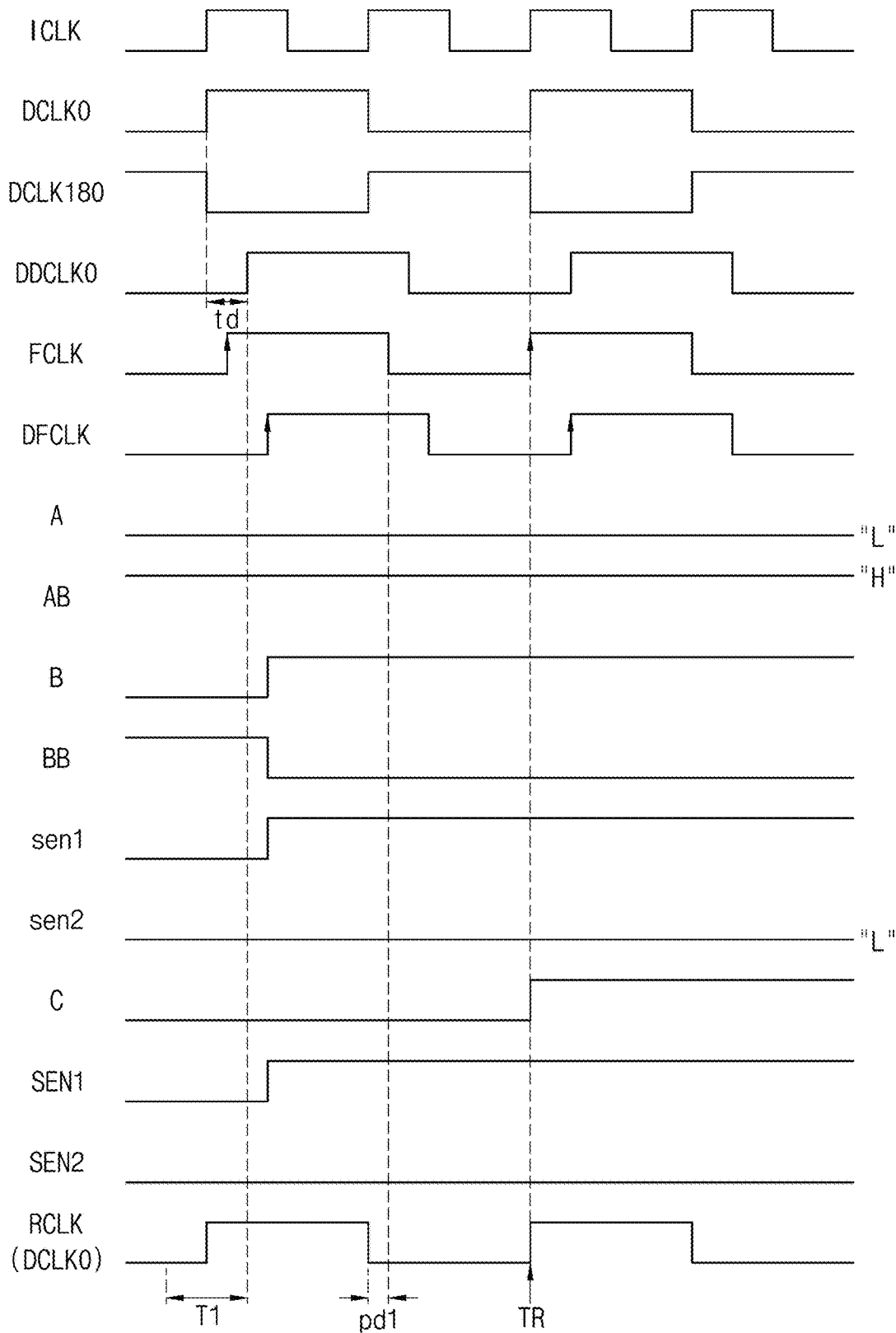
FIGS. 3A to 3C are timing diagrams for describing an operation of the selection signal generator according to some example embodiments of inventive concepts.

FIG. 3A is an operation timing diagram for describing an operation of the selection signal generator according to some example embodiments of inventive concepts. FIG. 3A is a diagram for describing the operation of the selection signal generator 20 when the rising edge of the feedback clock signal FCLK is generated within the third time td after the rising edge of the first divided clock signal DCLK0.

Referring to FIGS. 1 to 3A, the divider 10 may divide the input clock signal ICLK to generate the first divided clock signal DCLK0 and the second divided clock signal DCLK180. As shown, the first divided clock signal DCLK0 may be/correspond to a signal transitioning at the rising edge of the input clock signal ICLK, a frequency of the first divided clock signal DCLK0 may be ½ of that of the input clock signal ICLK, and the second divided clock signal DCLK180 may have the same frequency as and an inverted phase of the first divided clock signal DCLK0. The first delayer D1 may delay the first divided clock signal DCLK0 by the third time td to generate the delayed clock signal DDCLK0. The first flip-flop F/F1 may latch the delayed clock signal DDCLK0 having a "low" level to generate the first signal A having the "low" level and the inverted first signal AB having a "high" level in response to the rising edge of the feedback clock signal FCLK. The second delayer D2 may delay the feedback clock signal FCLK by the third time td to generate the delayed feedback clock signal DFCLK. The second flip-flop F/F2 may latch the first divided clock signal DCLK0 having the "high" level to generate the second signal B having the "high" level and the inverted second signal BB having the "low" level in response to the rising edge of the delayed feedback clock signal DFCLK. The first AND circuit (the first NAND gate NA1 and the first inverter I1) may perform an AND operation on the inverted first signal AB having the "high" level and the second signal B having the "high" level to generate the first detection signal sen1 having the "high" level. The second AND circuit (the second NAND gate NA2 and the second inverter I2) may perform the AND operation on the first signal A having the "low" level and the inverted second signal BB having the "low" level to generate the second detection signal sen2 having the "low" level. The third flip-flop F/F3 and the fourth flip-flop F/F4 may latch the first divided clock signal DCLK0 having the "high" level in response to the feedback clock signal FCLK having the "high" level, and delay the first divided clock signal DCLK0 by one clock cycle of the feedback clock signal FCLK to generate the third signal C having the "high" level. The first NOR gate NR1 may perform a NOR operation on the first detection signal sen1 having the "high" level and the third signal C having the "low" level to generate the fourth signal D having the "low" level. The second NOR gate NR2 may perform the NOR operation on the second detection signal den2 having the "low" level and the fourth signal D having the "low" level to generate the first selection signal SEN1 having the "high" level. The third inverter I3 may invert the first selection signal SEN1 having the "high" level to generate the second selection signal SEN2 having the "low" level. That is, the first NOR gate NR1, the second NOR gate NR2, and the third inverter I3 may generate the first selection signal SEN1 having the "high" level and the second selection signal SEN2 having the "low" level.

Referring now to FIGS. 1 to 3A, the selector 12 may generate the first divided clock signal DCLK0 as the reference clock signal RCLK in response to the first selection signal SEN1. The first phase detector 22-2 may be enabled in response to the first selection signal SEN1, detect a phase difference pd1 between the falling edge of the first divided clock signal DCLK0 and the falling edge of the feedback clock signal FCLK to generate a first phase difference detection signal PD1. The delay control unit 24 may perform a down (or up) counting operation on the code value code in response to the first phase difference detection signal PD1. The first delay unit 14-2 may delay the reference clock signal RCLK according to the code value code to generate the first clock signal CLK1. The second delay unit 14-4 may delay the first divided clock signal DCLK0 according to the code value code to generate the second clock signal CLK2. The clock signal delay path unit 16 may delay the first clock signal CLK1 to generate the output clock signal OCLK locked to the input clock signal ICLK. The clock signal delay replica unit 18 may delay the second clock signal CLK2 to generate the feedback clock signal FCLK locked to the first divided clock signal DCLK0 at a time point TR.

Figure 3B:
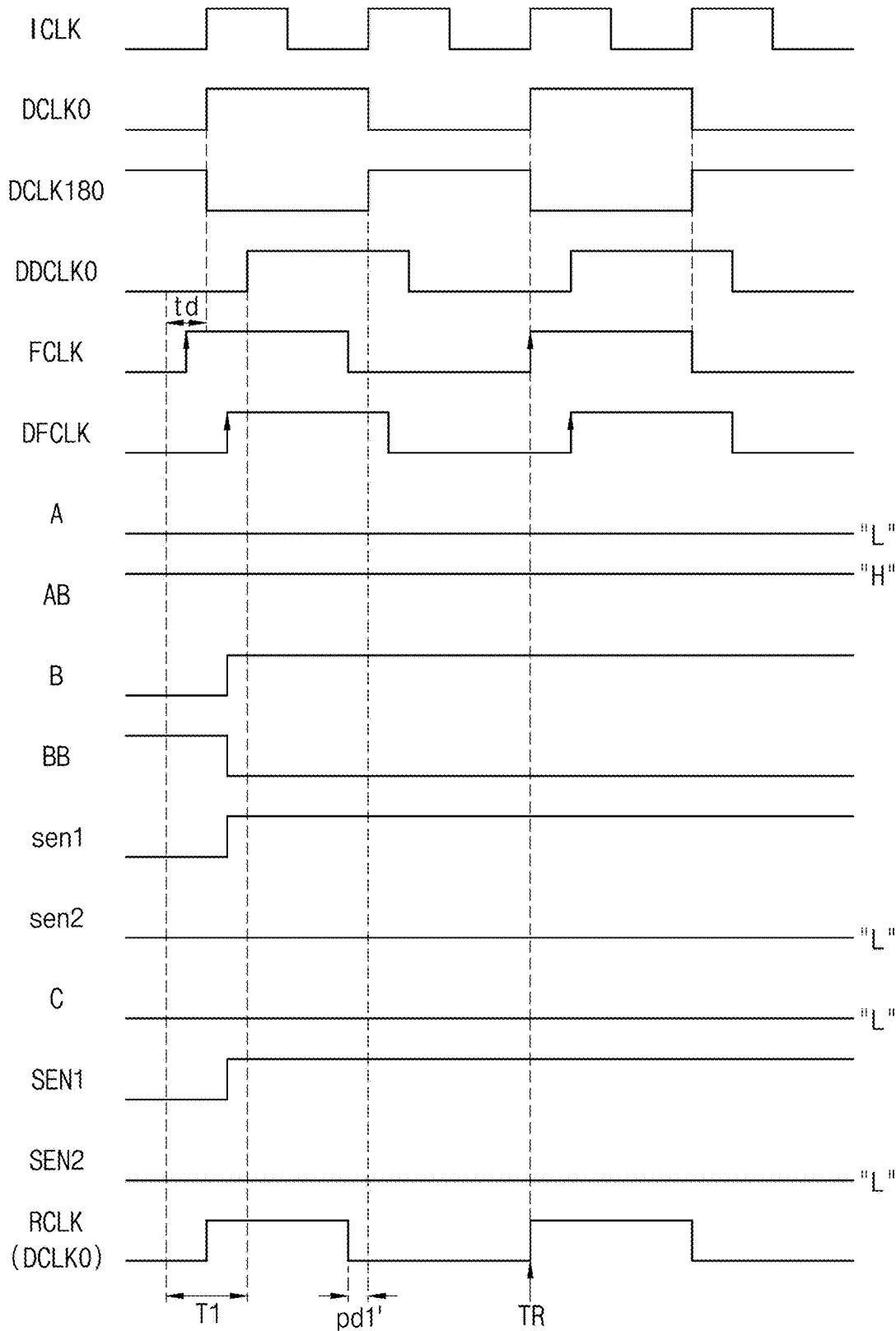

FIG. 3B is an operation timing diagram for describing an operation of the selection signal generator according to some example embodiments of inventive concepts. FIG. 3B is a diagram for describing an operation of the selection signal generator 20 when the rising edge of the feedback clock signal FCLK is generated within the third time td before the rising edge of the first divided clock signal DCLK0.

Referring to FIGS. 1, 2, and 3B, the selection signal generator 20 may perform the same operation as described above with reference to FIGS. 1 to 3A, and thus generate the first selection signal SEN1 having the "high" level and the second selection signal SEN2 having the "low" level. The first phase detector 22-2 may be enabled in response to the first selection signal SEN1, and detect a phase difference pd1' between the falling edge of the feedback clock signal FCLK and the falling edge of the first divided clock signal DCLK0 to generate the first phase difference detection signal PD1. The delay control unit 24 may perform an up (or down) counting operation on the code value code in response to the first phase difference detection signal PD1. After this, the operation of the delay locked loop circuit 100 may be easily understood with reference to the above description.

Referring to FIGS. 3A and 3B, the selection signal generator 20 may activate the first selection signal SEN1 and deactivate the second selection signal SEN2 when the rising edge of the feedback clock signal FCLK is present within the first period T1 including the third time td before and after the rising edge of the first divided clock signal DCLK0.

Figure 3C:
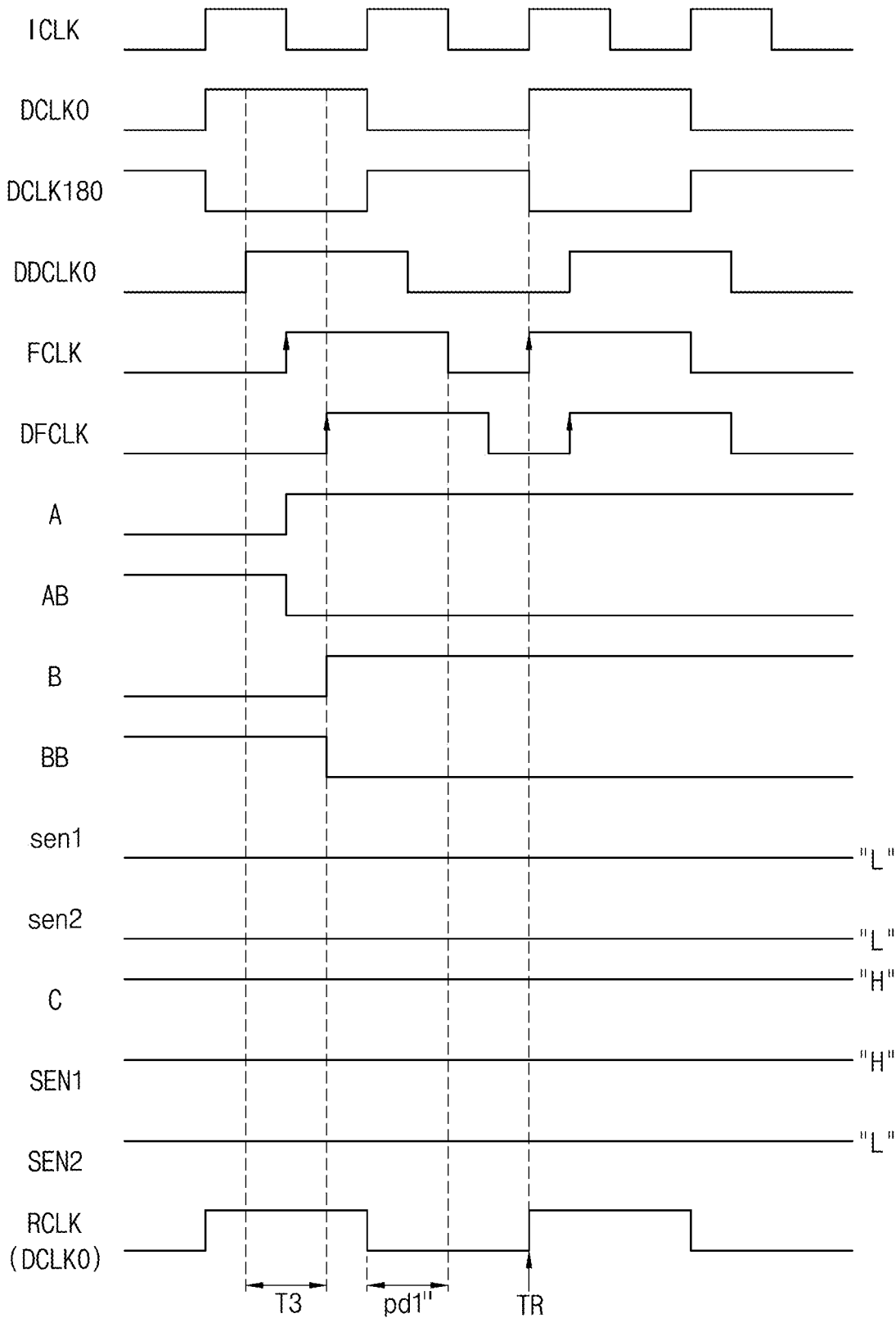

FIG. 3C is an operation timing diagram for describing an operation of the selection signal generator according to some example embodiments of inventive concepts. FIG. 3 is a diagram for describing an operation of the selection signal generator 20 when the rising edge of the feedback clock signal FCLK is generated within the third period T3 of the "high" level of the first divided clock signal DCLK0.

Referring to FIGS. 1, 2, and 3C, the selection signal generator 20 may perform the same operation as described above with reference to FIGS. 1 to 3A, and thus generate the first detection signal sen1 and the second detection signal sen2 having the "low" levels. In this case, the selection signal generator 20 may maintain the first selection signal SEN1 having the "high" level and the second selection signal SEN2 having the "low" level when the third signal C is the "high" level. That is, the selection signal generator 20 may maintain the first selection signal SEN1 having the "high" level and the second selection signal SEN2 having the "low" level shown in FIGS. 3A and 3B when the rising edge of the feedback clock signal FCLK is present within the third period T3 of the "high" level of the first divided clock signal DCLK0.

Referring to FIGS. 1, 2, and 3C, the first phase detector 22-2 may be enabled in response to the first selection signal SEN1, and detect a phase difference pd1" between the falling edge of the feedback clock signal FCLK and the falling edge of the first divided clock signal DCLK0 to generate the first phase difference detection signal PD1. The delay control unit 24 may perform a down (or up) counting operation on the code value code in response to the first phase difference detection signal PD1. Accordingly, the feedback clock signal FCLK locked to the first divided clock signal DCLK0 may be generated at the time point TR.

Figure 4A:
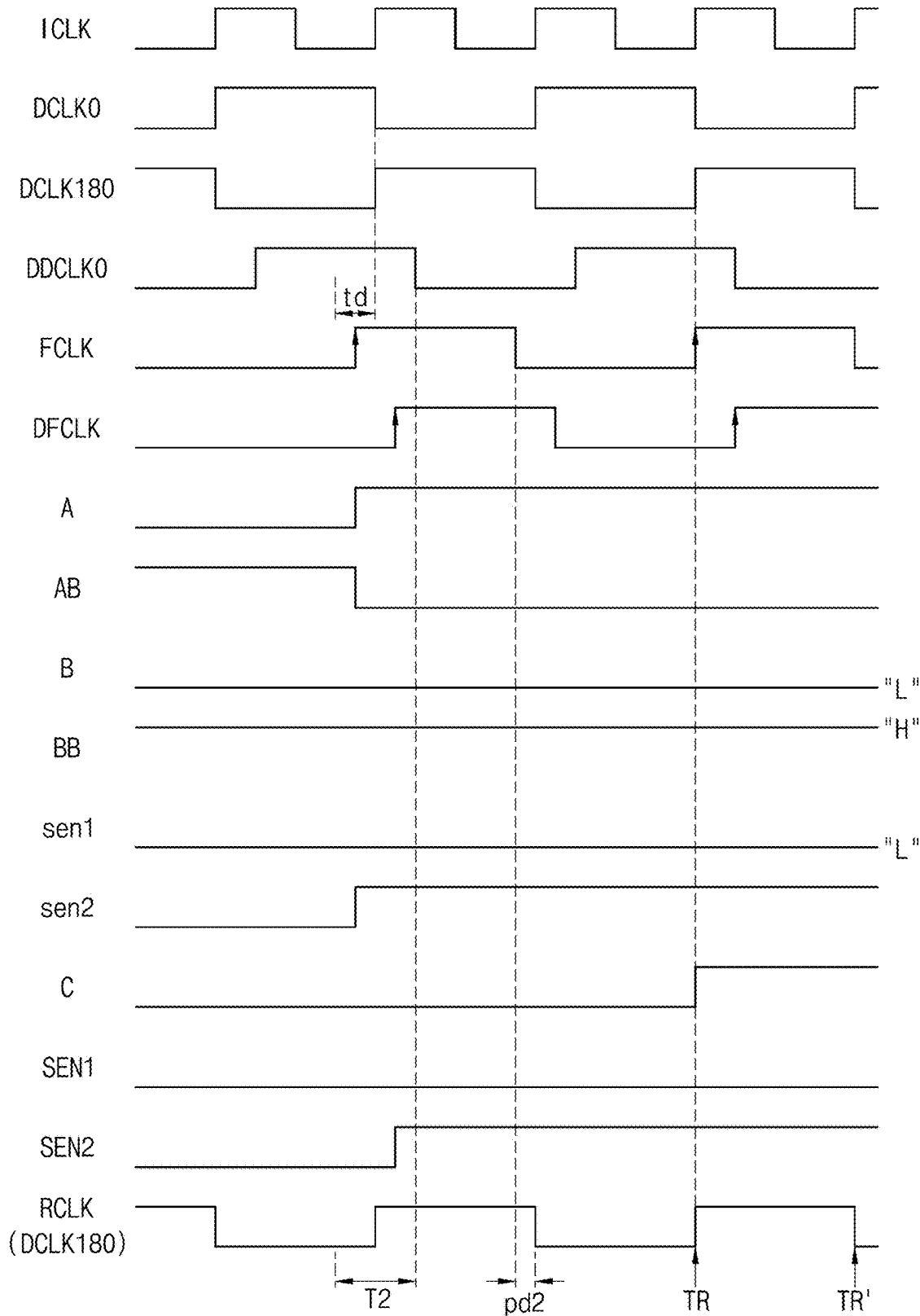
FIGS. 4A to 4C are timing diagrams for describing an operation of the selection signal generator according to some example embodiments of inventive concepts.

FIG. 4A is an operation timing diagram for describing an operation of the selection signal generator according to some example embodiments of inventive concepts. FIG. 4A is a diagram for describing an operation of the selection signal generator 20 when the rising edge of the feedback clock signal FCLK is generated within the third time td before the falling edge of the first divided clock signal DCLK0.

Referring to FIGS. 1, 2, and 4A, the divider 10 may divide the input clock signal ICLK to generate the first divided clock signal DCLK0 and the second divided clock signal DCLK180. The first delayer D1 may delay the first divided clock signal DCLK0 by the third time td to generate the delayed clock signal DDCLK0. The first flip-flop F/F1 may latch the delayed clock signal DDCLK0 having the "high" level to generate the first signal A having the "high" level and the inverted first signal AB having the "low" level in response to the rising edge of the feedback clock signal FCLK. The second delayer D2 may delay the feedback clock signal FCLK by the third time td to generate the delayed feedback clock signal DFCLK. The second flip-flop F/F2 may latch the first divided clock signal DCLK0 having the "low" level to generate the second signal B having the "low" level and the inverted second signal BB having the "high" level in response to the delayed feedback clock signal DFCLK. The first AND circuit (the first NAND gate NA1 and the first inverter I1) may perform an AND operation on the inverted first signal AB having the "low" level and the second signal B having the "low" level to generate the first detection signal sen1 having the "low" level. The second AND circuit (the second NAND gate NA2 and the second inverter I2) may perform the AND operation on the first signal A having the "high" level and the inverted second signal BB having the "high" level to generate the second detection signal sen2 having the "high" level. The third flip-flop F/F3 and the fourth flip-flop F/F4 may latch the first divided clock signal DCLK0 having the "high" level, and delay the first divided clock signal DCLK0 by one clock cycle of the feedback clock signal FCLK to generate the third signal C having the "high" level, in response to the feedback clock signal FCLK having the "high" level. The first NOR gate NR1 may perform a NOR operation on the first detection signal sen1 having the "low" level and the third signal C having the "low" level to generate the fourth signal D having the "high" level. The second NOR gate NR2 may perform the NOR operation on the second detection signal sen2 having the "high" level and the fourth signal D having the "high" level to generate the first selection signal SEN1 having the "low" level. The third inverter I3 may invert the first selection signal SEN1 having the "low" level to generate the second selection signal SEN2 having the "high" level. That is, the first NOR gate NR1, the second NOR gate NR2, and the third inverter I3 may generate the first selection signal SEN1 having the "low" level and the second selection signal SEN2 having the "high" level when the second detection signal sen2 has the "high" level.

Referring to FIGS. 1, 2, and 4A, the selector 12 may generate the second divided clock signal DCLK180 as the reference clock signal RCLK in response to the second selection signal SEN2. The second phase detector 22-4 may be enabled in response to the second selection signal SEN2, and detect the phase difference pd2 between the falling edge of the feedback clock signal FCLK and the falling edge of the second divided clock signal DCLK180 to generate the second phase difference detection signal PD2. The delay control unit 24 may perform an up (or down) counting operation on the code value code in response to the second phase difference detection signal PD2. The first delay unit 14-2 may delay the reference clock signal RCLK according to the code value code to generate the first clock signal CLK1. The second delay unit 14-4 may delay the second divided clock signal DLCK180 according to the code value code to generate the second clock signal CLK2. The clock signal delay path unit 16 may delay the first clock signal CLK1 to generate the output clock signal OCLK locked to the input clock signal ICLK. The clock signal delay replica unit 18 may delay the second clock signal CLK2 to generate the feedback clock signal FCLK locked to the second divided clock signal DCLK180 at the time point TR.

Figure 4B:
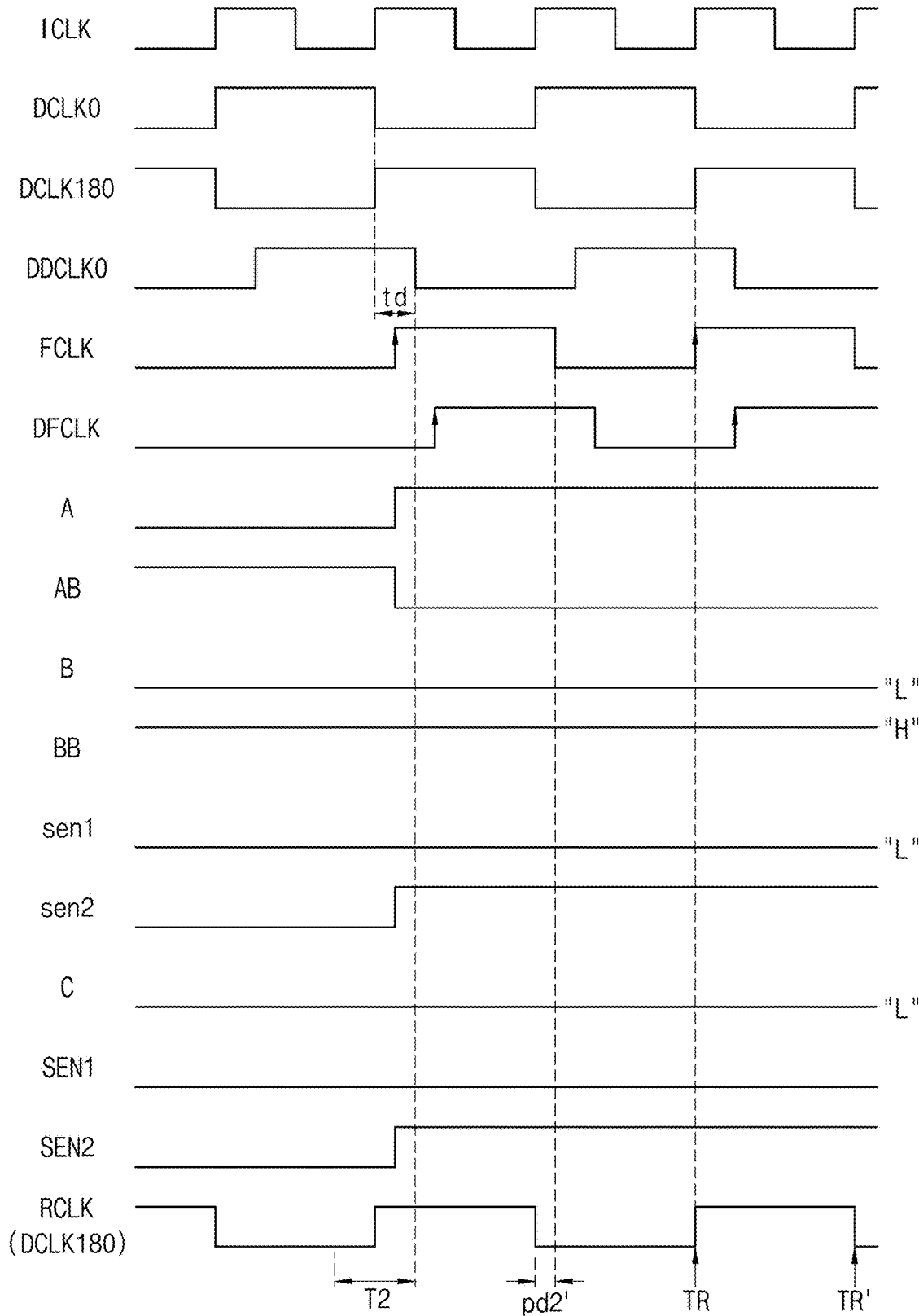

FIG. 4B is an operation timing diagram for describing an operation of the selection signal generator according to some example embodiments of inventive concepts. FIG. 4B is a diagram for describing an operation of the selection signal generator 20 when the rising edge of the feedback clock signal FCLK is generated within the third time td after the falling edge of the first divided clock signal DCLK0.

Referring to FIGS. 1, 2, and 4B, as described above with reference to FIGS. 1, 2, and 4A, the selection signal generator 20 may generate the first selection signal SEN1 having the "low" level and the second selection signal SEN2 having the "high" level. The second phase detector 22-4 may be enabled in response to the second selection signal SEN2, and detect a phase difference pd2' between the falling edge of the second divided clock signal DCLK180 and the falling edge of the feedback clock signal FCLK to generate the second phase difference detection signal PD2. The delay control unit 24 may perform the down (or up) counting operation on the code value code in response to the second phase difference detection signal PD2. After this, the operation of the delay locked loop circuit 100 may be easily understood with reference to the above description.

Referring to FIGS. 4A and 4B, the selection signal generator 20 may deactivate the first selection signal SEN1 and activate the second selection signal SEN2 when the rising edge of the feedback clock signal FCLK is present within the second period T2 including the third time td before and after the falling edge of the first divided clock signal DCLK0.

Figure 4C:
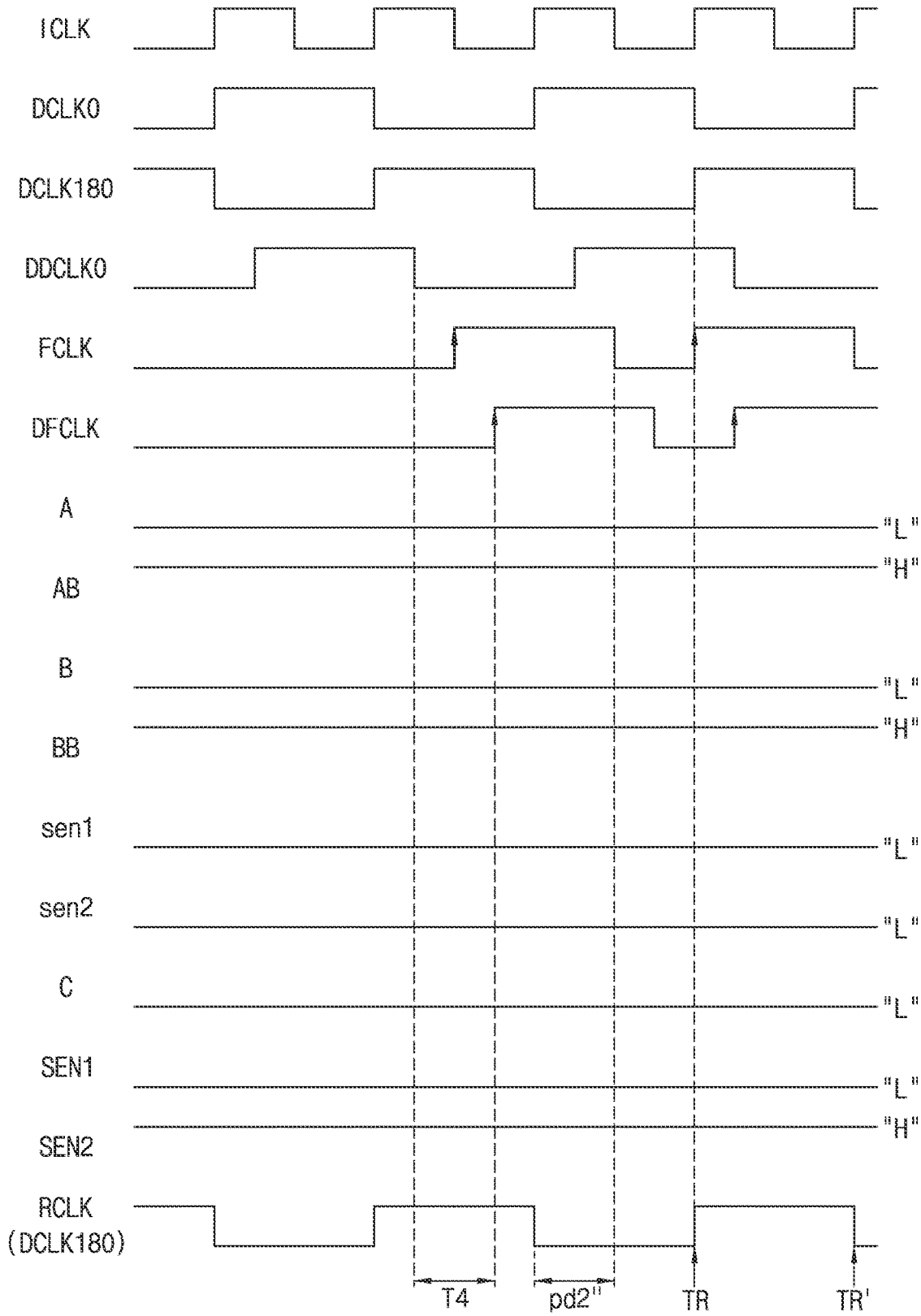

FIG. 4C is an operation timing diagram for describing an operation of the selection signal generator according some example embodiments of inventive concepts. FIG. 4C is a diagram for describing an operation of the selection signal generator 20 when the rising edge of the feedback clock signal FCLK is generated within the fourth period T4 of the "low" level of the first divided clock signal DCLK0.

Referring to FIGS. 1, 2, and 4C, the selection signal generator 20 may perform the same operation as described above with reference to FIGS. 1, 2, and 4A, and generate the first detection signal sen1 and the second detection signal sen2 having the "low" levels. In this case, the selection signal generator 20 may maintain the first selection signal SEN1 having the "low" level and the second selection signal SEN2 having the "high" level when the third signal C has the "low" level. That is, the selection signal generator 20 may maintain the first selection signal SEN1 having the "low" level and the second selection signal SEN2 having the "high" level shown in FIGS. 4A and 4B when the rising edge of the feedback clock signal FCLK is present within the fourth period T4 of the "low" level of the first divided clock signal DCLK0.

Referring to FIGS. 1, 2 and 4C, the second phase detector 22-4 may be enabled in response to the second selection signal SEN2, and detect a phase difference pd2" between the falling edge of the feedback clock signal FCLK and the falling edge of the second divided clock signal DCLK180 to generate the second phase difference detection signal PD2. The delay control unit 24 may perform the down (or up) counting operation on the code value code in response to the second phase difference detection signal PD2. Accordingly, the feedback clock signal FCLK locked to the second divided clock signal DCLK180 may be generated at a time point TR.

Unlike that described above with reference to FIGS. 4A to 4C, when using not the second divided clock signal DCLK180 but the first divided clock signal DCLK0 as the reference clock signal RCLK, the feedback clock signal FCLK locked to the first divided clock signal DCLK0 may be generated at a time point TR' which is delayed by one clock cycle of the input clock signal ICLK compared with the time point TR. That is, a locking time locked to the input clock signal ICLK may be further delayed by one clock cycle, and the number of delay cells (not shown) of the first delay unit 14-2 may be increased in order to further delay one clock cycle of the input clock signal ICLK.

Accordingly, the delay locked loop circuit 200 according to some example embodiments of inventive concepts may rapidly perform a delay locking operation, and the number of delay cells of the first delay circuit 14-2 may not be increased.

Figure 5:
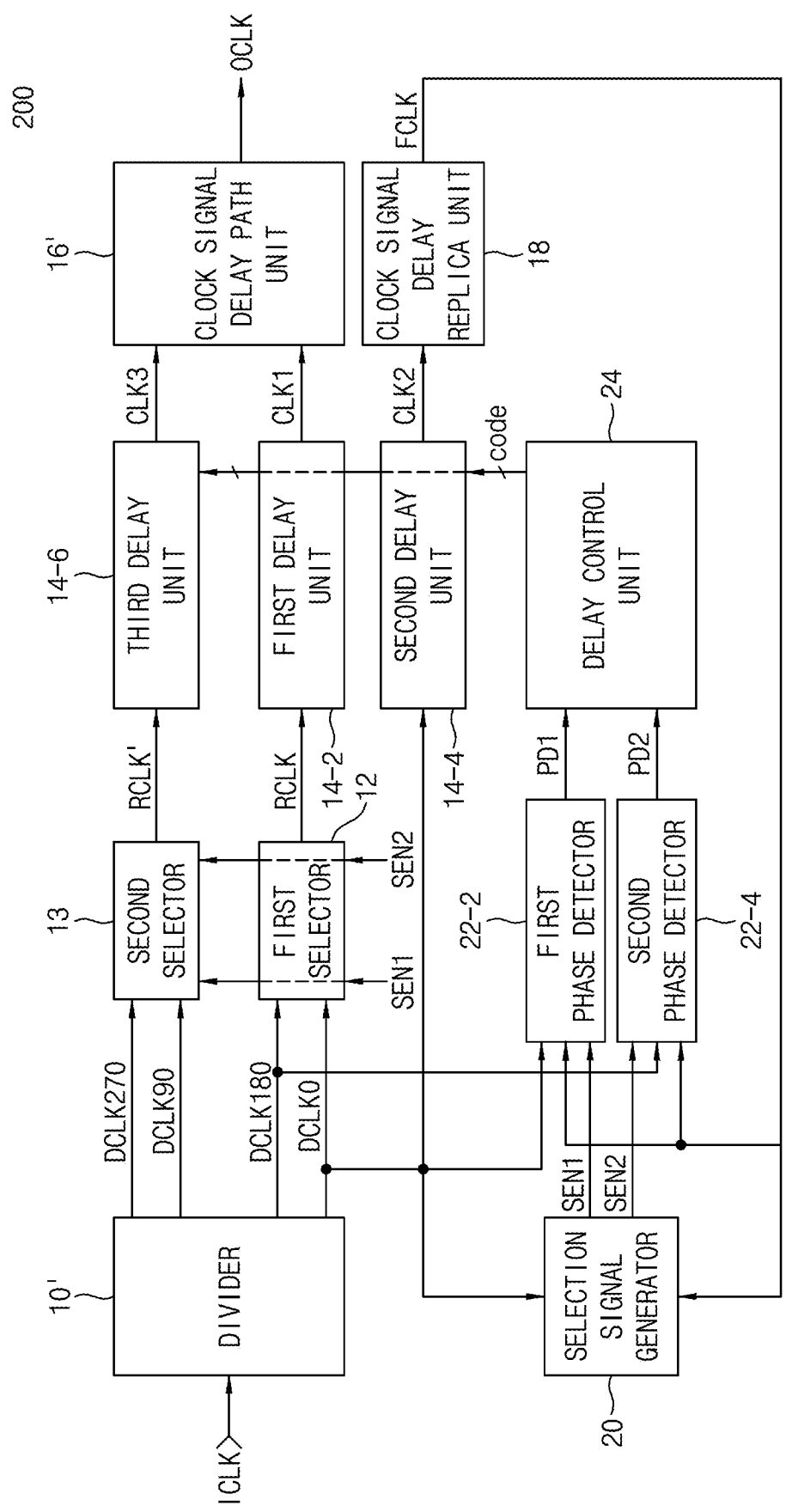
FIG. 5 is a block diagram illustrating a configuration of a delay locked loop circuit according to some example embodiments of inventive concepts.

FIG. 5 is a block diagram illustrating a configuration of the delay locked loop circuit according to some example embodiments of inventive concepts. The delay locked loop circuit 200 may further include a second selector 12 and a third delay unit 14-6 in the delay locked loop circuit 100 shown in FIG. 1, and include the divider 10 and the clock signal delay path unit 16 instead of a divider 10' and a clock signal delay path unit 16' of the delay locked loop circuit 100 shown in FIG. 1. In FIG. 5, the first selector 12 may be the same as the selector 12 shown in FIG. 1, and a first reference clock signal RCLK may be the same as the reference clock signal RCLK shown in FIG. 1.

Functions of the blocks/circuits having the same reference numerals the blocks/circuits shown in FIG. 1 among the blocks/circuits shown in FIG. 5 may be easily understood with reference to the above description, and functions of the blocks/circuits which are added or replaced will be described below.

The divider 10' may divide the input clock signal ICLK to generate a third divided clock signal DCLK90 and a fourth divided clock signal DCLK270 as well as the first divided clock signal DCLK0 and the second divided clock signal DCLK180. A frequency of each of the first to fourth divided clock signals DCLK0, DCLK90, DCLK180, and DCLK270 may be ½ of that of the input clock signal ICLK. The third divided clock signal DCLK90 may be a clock signal having an inverted phase (180-degree phase difference) of the fourth divided clock signal DCLK270, and have 90-degree phase difference with the first divided clock signal DCLK0.

The second selector circuit 13 may generate the third divided clock signal DCLK90 as a second reference clock signal RCLK' in response to the first selection signal SEN1, and generate the fourth divided clock signal DCLK270 as the second reference clock signal RCLK' in response to the second selection signal SEN2.

The third delay unit 14-6 may include third delay cells (not shown) which are connected in series, and variably delay the second reference clock signal RCLK' according to the code value code to generate a third clock signal CLK3. The number of the third delay cells (not shown) may the same as that of the first delay cells (not shown) or the second delay cells (not shown), and the first delay unit 14-2, the second delay unit 14-4, and the third delay unit 14-6 may delay the first reference clock signals RCLK, the first divided clock signal DCLK0, and the second reference clock signal RCLK' by the same first time according to the code value code.

The clock signal delay path unit 16' may receive the first clock signal CLK1 and the third clock signal CLK3 to generate the output clock signal OCLK. For example, the clock signal delay path unit 16' may generate the output clock signal OCLK having the same frequency and the same phase as (0 degree phase difference with) the input clock signal ICLK using the first clock signal CLK1 and the third clock signal CLK3.

When the divider 10' of the delay locked loop circuit 200 shown in FIG. 5 is configured to generate the first to fourth divided clock signals DCLK0, DCLK90, DCLK180, and DCLK270, the second selector 13 and the third delay unit 14-6 may further generate the third clock signal CLK3 having 90-degree phase difference with the first clock signal CLK1, and the clock signal delay path unit 16' may mix the phases of the first clock signal CLK1 and the third clock signal CLK3 to generate the output clock signal OCLK having the same frequency and the same phase as the input clock signal ICLK.

Figure 6:
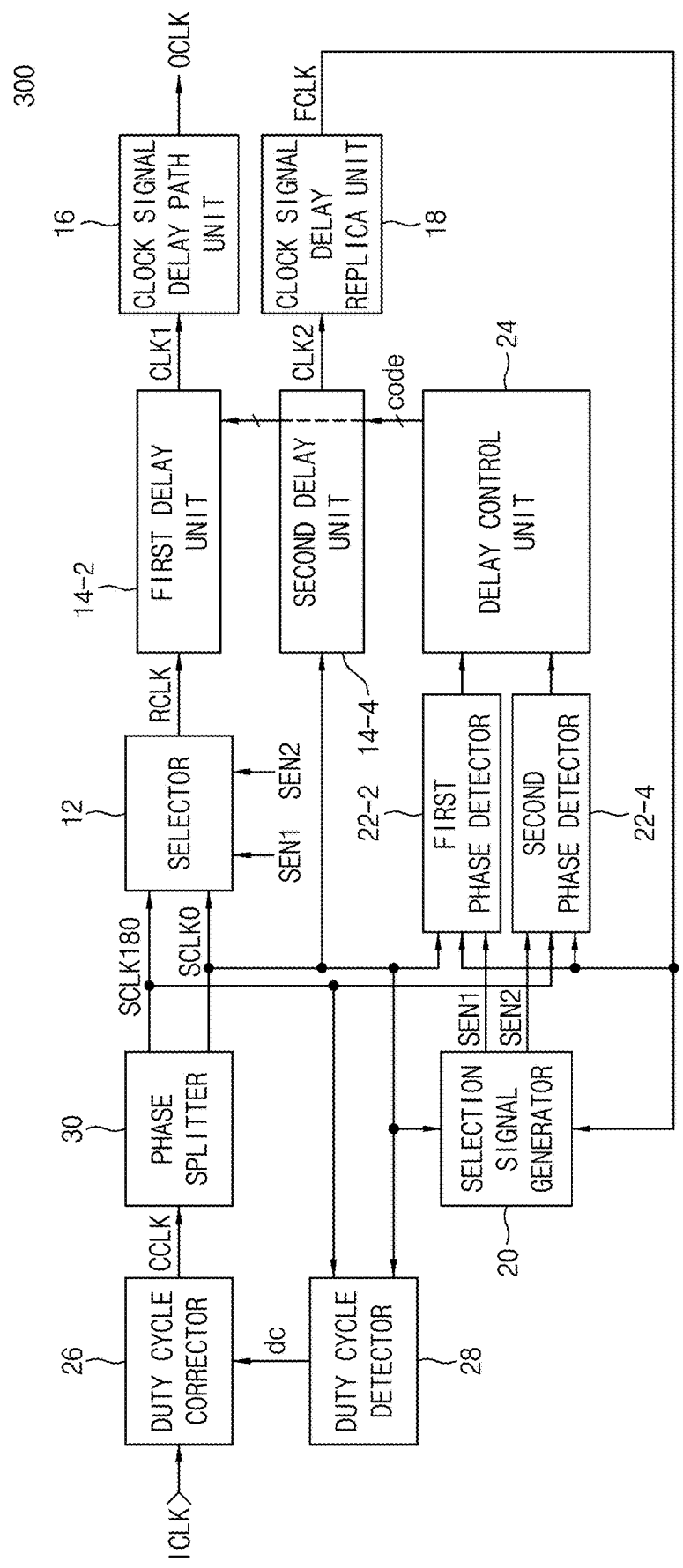
FIG. 6 is a block diagram illustrating a configuration of a delay locked loop circuit according to some example embodiments of inventive concepts.

FIG. 6 is a block diagram illustrating a configuration of a delay locked loop circuit according to some example embodiments of inventive concepts. The delay locked loop circuit 300 may further include a duty cycle corrector 26, a duty cycle detector 28, and a phase splitter 30 in the delay locked loop circuit 100 shown in FIG. 1.

Functions of the blocks/circuits having the same reference numbers as those shown in FIG. 1 among the blocks/circuits shown in FIG. 6, may be easily understood by referring to the above description, and functions of the additional blocks/circuits will be described below.

The duty cycle corrector 26 may correct the duty ratio of the input clock signal ICLK to 50% in response to the duty detection signal dc to generate a duty corrected clock signal CCLK.

The phase splitter 30 may split a phase of the duty corrected clock signal CCLK to generate a first splitted clock signal SCLK0 having the same frequency and the same phase as the duty corrected clock signal CCLK and a second splitted clock signal SCLK180 having the same frequency as and an inverted phase of the duty corrected clock signal CCLK. The first splitted clock signal SCLK0 and the second splitted clock signal SCLK180 may correspond to the first divided clock signal DCLK0 and the second divided clock signal DCLK180 shown in FIG. 1.

The duty cycle detector 28 may detect a duty ratio using the first splitted clock signal SCLK0 and the second splitted clock signal SCLK180 to generate the duty detection signal dc. For example, the duty cycle detector 28 may detect a difference between a "high" level period of the first splitted clock signal SCLK0 and a "high" level period of the second splitted clock signal SCLK180 to generate the duty detection signal dc.

The delay locked loop circuit 300 shown in FIG. 6 may generate the first splitted clock signal SCLK0 and the second splitted clock signal SCLK180 having the duty ratio of 50% by the duty cycle corrector 26, the duty cycle detector 28, and the phase splitter 30 when the duty ratio of the input clock signal ICLK is not 50%. After this, the operation of the delayed locked loop circuit 300 may perform the same operation as described above with reference to FIGS. 1 to 4C.

Figure 7A:
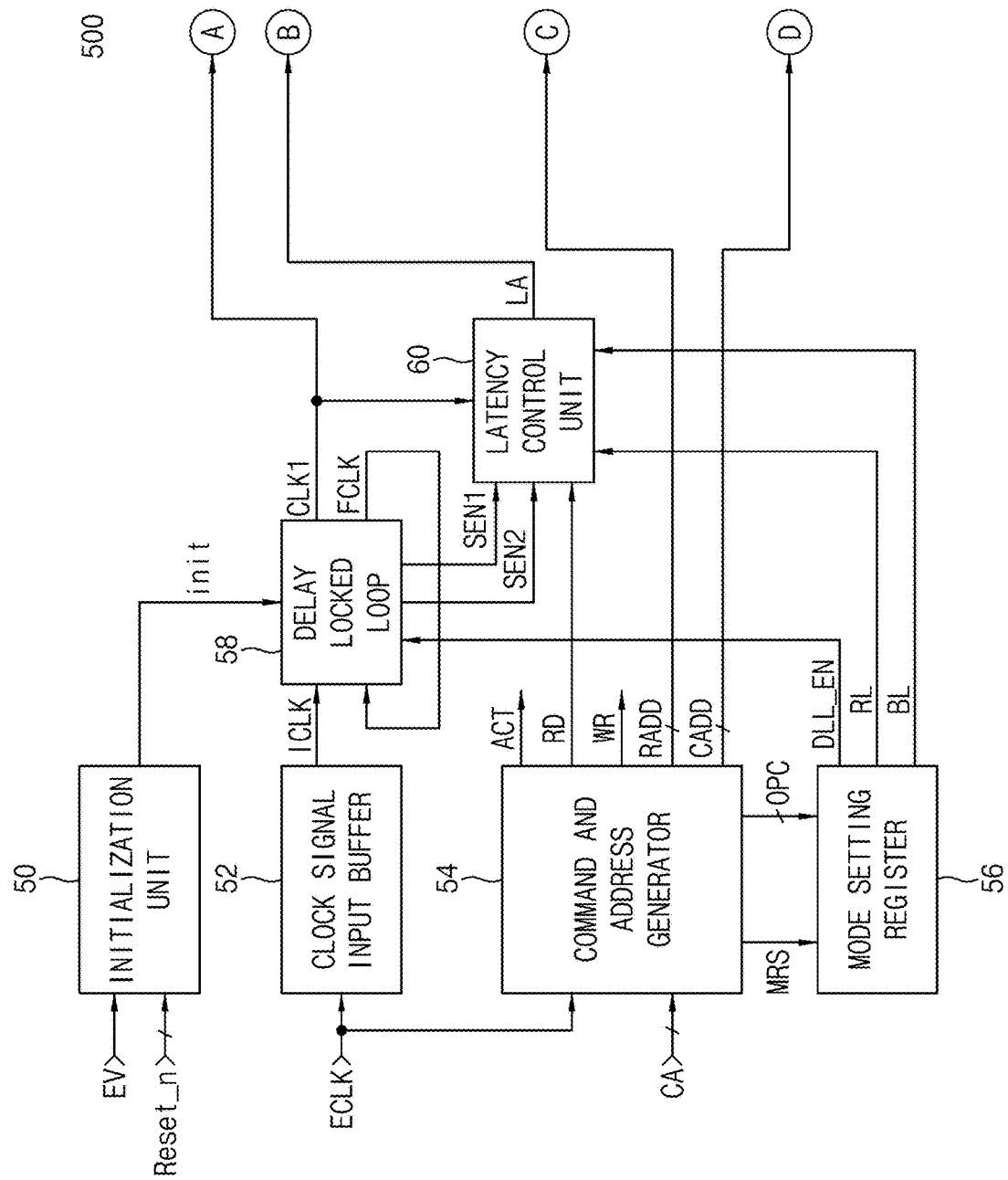
FIGS. 7A and 7B are a block diagram illustrating a configuration of a semiconductor memory device according to some example embodiments of inventive concepts.
Figure 7B:
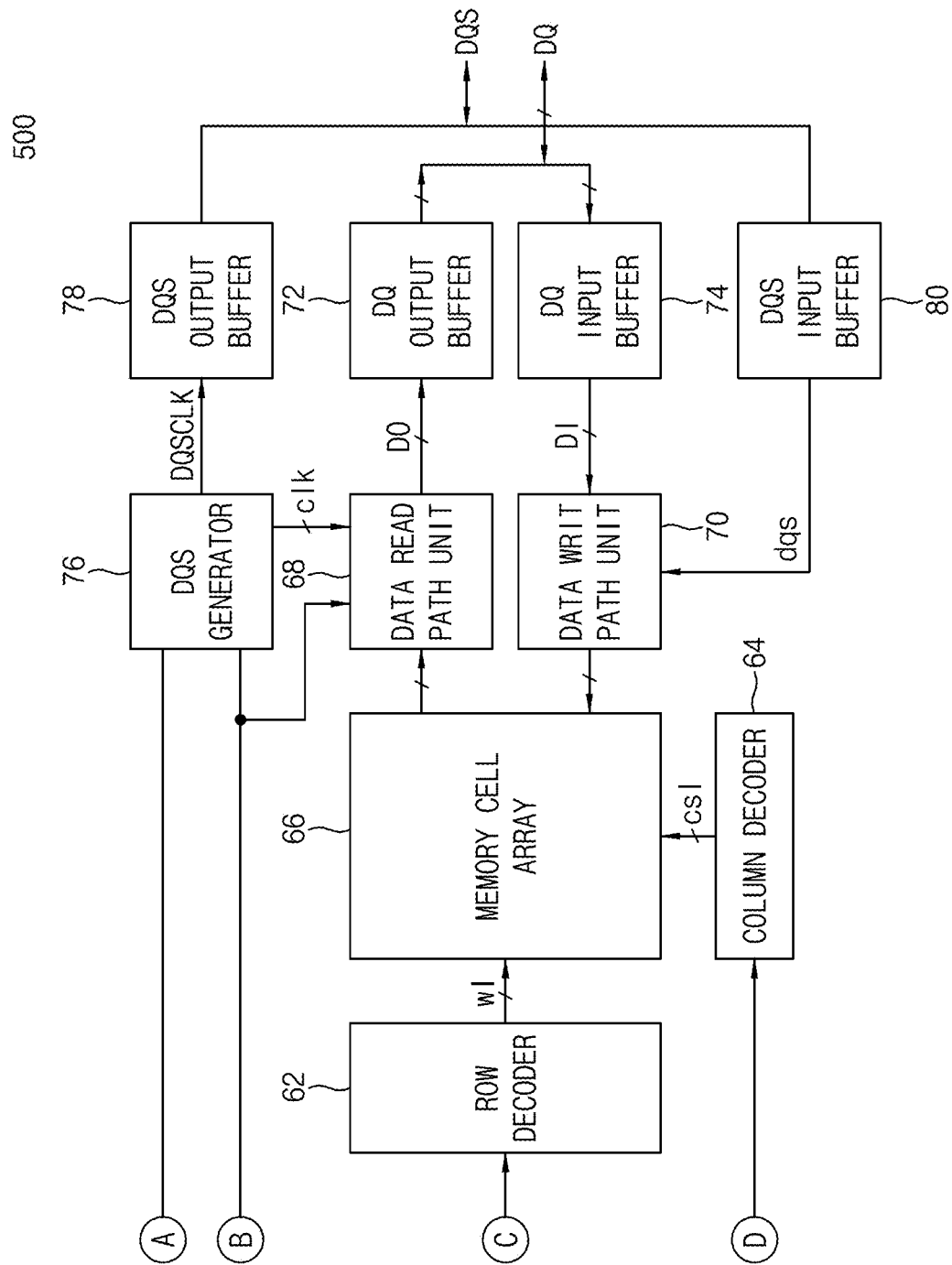

FIGS. 7A and 7B are a block diagram illustrating a semiconductor memory device according to some example embodiments of inventive concepts. The semiconductor memory device 500 may include an initialization unit 50, a clock signal input buffer 52, a command and the address generator 54, a mode setting register 56, a delay locked loop 58, a latency control unit 60, a row decoder 62, a column decoder 64, a memory cell array 66, a data read path unit 68, a data write path unit 70, a data (DQ) output buffer 72, a DQ input buffer 74, a data strobe signal (DQS) generator 76, a DQS output buffer 78, and a DQS input buffer 78.

Functions of the blocks/circuits shown in FIGS. 7A and 7B will be described below.

The initialization unit 50 may generate an initialization signal init when a reset signal Reset_n transitioning to a "high" level from an external source is applied after an external power voltage (EV) supplied from the external source reaches a target voltage level.

The clock signal input buffer 52 may buffer and delay the external clock signal ECLK by a fourth time to generate the input clock signal ICLK.

The command and address generator 54 may decode the command and address CA in response to the external clock signal ECLK to generate a mode setting command MRS, an active command ACT, a read command RD, and a write command WR. In addition, the command and address generator 54 may generate an address signal included in the command and address CA as a mode setting code OPC in response to the mode setting command MRS, and generate the address signal included in the command and address CA as a row address RADD in response to the active command ACT, and generate the address signal included in the command and address CA as a column address CADD in response to the read command RD or the write command WR.

The mode setting register 56 may store the mode setting code OPC in response to the mode setting command MRS to set a delay locked loop enable signal DLL_EN, a read latency RL, and a burst length BL. The mode setting register 56 may receive the mode setting code OPC to activate the delay locked loop enable signal DLL_EN.

The delay locked loop 58 may perform a delay locking operation to generate a feedback clock signal FCLK locked to the input clock signal ICLK applied from the external source in response to the initialization signal init and the delay locked loop enable signal DLL_EN. The delay locked loop 58 may perform the delay locking operation whenever the delay locked loop enable signal DLL_EN is generated regardless of the initialization signal init. The delay locked loop 58 may have a configuration except for the clock signal delay path unit 16 or 16' of the delay locked loop circuit 100, 200, or 300 as described above with reference to FIG. 1, 5, or 6.

The latency control unit 60 may generate a latency signal LA which is activated after delaying by the number of clock cycles corresponding to a value of the read latency RL and is deactivated after delaying by the number of clock cycles corresponding to the value of the read latency+the number of clock cycles corresponding to a value of the burst length RL using the first clock signal CLK1 when a first selection signal SEN1 is activated and the read command RD is applied. On the other hand, the latency control unit 60 may delay the latency signal LA by one clock cycle of the external clock signal ECLK (the input clock signal ICLK) when the second selection signal SEN2 is activated and the read command RD is applied. For example, the latency control unit 60 may generate the latency signal LA which is activated after delaying by the number of clock cycles corresponding to the value of the read latency RL+one clock cycle of the external clock signal ECLK (the input clock signal ICLK) and is deactivated after delaying by the number of clock cycles corresponding to the value of the read latency RL + the number of clock cycles corresponding to the value of the burst length BL + one clock cycle of the external clock signal ECLK (the input clock signal ICLK) using the first clock signal CLK1 when the second selection signal SEN2 is activated and the read command RD is applied. In this regard, with reference to FIGS. 3A to 3C, when the first selection signal SEN1 is activated, the first divided clock signal DCLK0 may be generated as the reference clock signal RCLK, and with reference to FIGS. 4A to 4C, when the second selection signal SEN2 is activated, the second divided clock signal DCLK180 may be generated as the reference clock signal RCLK. Accordingly, the first clock signal CLK1 generated when the second selection signal SEN2 is activated may be a clock signal generated before one clock cycle of the input clock signal ICLK (the external clock signal ECLK). Therefore, when the second selection signal SEN2 is activated, the latency control unit 60 may delay the latency signal LA by one clock cycle of the input clock signal ICLK (the external clock signal ECLK0) compared to when the first selection signal SEN1 is activated.

The row decoder 62 may decode the row address RADD to generate a plurality of word line selection signals wl.

The column decoder 64 may decode the column address CADD to generate a plurality of column selection signal lines csl.

The memory cell array 66 may include a plurality of memory cells (not shown) such as volatile and/or non-volatile memory cells, connected between a plurality of word lines selected by a plurality of word line selection signals wl and a plurality of bit lines selected by a plurality of column selection signals csl. The memory cell array 66 may output data from memory cells selected by the plurality of word line selection signals wl and the plurality of column selection signals csl in response to the read command RD, and input data to memory cells selected by the plurality of word line selection signals wl and the plurality of column selection signals csl in response to the write command WR.

The data read path unit 68 may latch the data output from the memory cell array 66, and output data DO in response to the internal clock signal clk during an activation period of the latency signal LA.

The data write path unit 70 may latch data DI in response to an input data strobe signal dqs, and output the data to the memory cell array 66.

The DQ output buffer 72 may buffer the data DO to generate data DQ.

The data input buffer 74 may buffer data DQ received from the external source to generate the data DI.

The DQS generator 76 may generate a DQS clock signal DQSCLK using the first clock signal CLK1 in response to the latency signal LA. When the delay locked loop circuit 100 of FIG. 1 is used as the delay locked loop 58, the DQS generator 76 may further generate internal clock signals clk0 and clk180 having 0 degree and 180-degree phase differences with the first clock signal CLK1 using the first clock signal CLK1. When the delay locked loop circuit 200 of FIG. 5 is used as the delay locked loop 58, the DQS generator 76 may generate internal clock signals clk0, clk90, clk180 and clk270 having 0 degree, 90-degree, 180-degree, and 270-degree phase differences with the first clock signal CLK1 with using the first clock signal CLK1. When the delay locked loop circuit 300 of FIG. 6 is used as the delay locked loop 58, the DQS generator 76 may generate an internal clock signal CLK0 having the same frequency as the first clock signal CLK1 (the external clock signal ECLK) using the first clock signal CLK1. In FIG. 7B, at least one internal clock signal is represented by clk.

The DQS output buffer 78 may buffer the DQS clock signal DQSCLK to generate the data strobe signal DQS having the same frequency and the same phase as the external clock signal ECLK. The data strobe signal DQS may be the output clock signal OCLK of FIG. 1, 5, or 6. The DQS generator 76 and the DQS output buffer 78 may correspond to the clock signal delay path unit 16 or 16' shown in FIG. 1, 5, or 6.

For example the delay locked loop 58, the DQS generator 76, and the DQS output buffer 78 may configure the delay locked loop circuit 100, 200, or 300 shown in FIG. 1, 5, or 6. The clock signal delay replica unit 18 shown in FIG. 1, 5, or 6 may be configured to have a delay time corresponding to the fourth time+the second time (a delay time of the DQS generator 76+a delay time of the DQS output buffer 78)+a line delay time. The line delay time may be a delay time by a signal line until the first clock signal CLK1 output from the delay locked loop 58 is applied to the DQS generator 76.

The DQS input buffer 80 may buffer the data strobe signal DQS received from the external source to generate the input data strobe signal dqs.

In the above-described example embodiments, the rising edge of the reference clock signal RCLK and the rising edge of the feedback clock signal FCLK may be or correspond to the falling edge of the reference clock signal RCLK and the falling edge of the feedback clock signal FCLK, respectively, and the falling edge of the reference clock signal RCLK and the falling edge of the feedback clock signal FCLK may be or correspond to the rising edge of the reference clock signal RCLK and the rising edge of the feedback clock signal FCLK, respectively.

Accordingly, the delay locked loop circuit according to example embodiments of inventive concepts may rapidly generate the output clock signal locked to the input clock signal. Therefore, the operations of the delay locked loop circuit and the semiconductor memory device having the same may be improved.

As used herein, terms such as "blocks", "units", "registers", and "circuits", along with other terms ending in "-er" or "-or", may be or include electrical components, such as, but not limited to, transistors, capacitors, inductors, resistors, logic gates, flip flops, etc. Terms such as "blocks", "units", "registers", and "circuits", and terms ending in "-er" or "-or", may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While disclosures have been particularly shown and described with reference to non-limiting example embodiments thereof, it will be apparent to those of ordinary skill in the art that various changes in form and detail may be made without departing from the spirit and essential characteristics of inventive concepts. The above embodiments are therefore to be construed in all aspects as illustrative and not restrictive.

What is claimed is:

1. A delay locked loop circuit comprising:
a first selector circuit configured to generate a first internally generated clock signal as a first reference clock signal in response to a first selection signal, and to generate a second internally generated clock signal as the first reference signal in response to a second selection signal;
a first delay circuit configured to delay the first reference clock signal by a first time according to a code value to generate a first clock signal;
a second delay circuit configured to generate a second clock signal by delaying the first internally generated clock signal by the first time according to the code value according to the code value;
a clock signal delay path circuit configured to delay the first clock signal by a second time to generate an output clock signal;
a clock signal delay replica circuit configured to delay the second clock signal by the second time to generate a feedback clock signal;
a selection signal generator circuit configured to activate the first selection signal in response to a first edge of the feedback clock signal being present within a first period including a third time before and after the first edge of the first internally generated clock signal, and to activate the second selection signal in response to the first edge of the feedback clock signal being present within a second period including the third time before and after a second edge of the first internally generated clock signal; and
a phase detection and delay control circuit configured to detect a phase difference between the feedback clock signal and the first internally generated clock signal to generate a first phase difference detection signal in response to the first selection signal being activated, to detect a phase difference between the feedback clock signal and the second internally generated clock signal to generate a second phase difference detection signal in response to the second selection signal being activated, and to change the code value in response to the first phase difference detection signal or the second phase difference detection signal.

2. The delay locked loop circuit of claim 1, further comprising:
a divider circuit configured to divide an input clock signal to generate a first divided clock signal which is the first internally generated clock signal and a second divided clock signal which has an inverted phase of the first internally generated clock signal and is the second internally generated clock signal;
wherein the selection signal generator circuit comprises:
a first detector circuit configured to activate a first detection signal in response to the first edge of the feedback clock signal being present within the first period;
a second detector circuit configured to activate a second detection signal in response to the first edge of the feedback clock signal being present within the second period; and
a third detector circuit configured to activate the first selection signal in response to the first edge of the feedback clock signal being present within the first period, or within a third period of a first level of the first divided clock signal except for the first period and the second period, and to activate the second selection signal in response to the first edge of the feedback clock signal being present within the second period, or within a fourth period of a second level of the first divided clock signal except for the first period and the second period.

3. The delay locked loop circuit of claim 2, wherein the divider circuit is configured to divide the input clock signal to further generate a third divided clock signal having 90-degree phase difference with the first divided clock signal and to generate a fourth divided clock signal having an inverted phase of the third divided clock signal, and wherein the delay locked loop circuit further comprises:
a second selector circuit configured to generate the third divided clock signal as a second reference clock signal in response to the first selection signal, and to generate the fourth divided clock signal as the second reference clock signal in response to the second selection signal; and
a third delay circuit configured to delay the second reference clock signal by the first time to generate a third clock signal.

4. The delay locked loop circuit of claim 3, wherein the output clock signal has the same frequency and the same phase as the input clock signal, and the feedback clock signal has the same frequency as the first divided clock signal.

5. The delay locked loop circuit of claim 3, wherein the first detector circuit and the second detector circuit comprises:
a first delayer circuit configured to delay the first divided clock signal by the third time to generate a first delayed clock signal;
a first flip-flop configured to latch the first delayed clock signal to generate a first signal and an inverted first signal in response to the feedback clock signal;
a second delayer circuit configured to delay the feedback clock signal by the third time to generate a second delayed clock signal; and
a second flip-flop configured to latch the first divided clock signal to generate a second signal and an inverted second signal in response to the second delayed clock signal,
wherein the first detector circuit further comprises:
a first AND circuit configured to perform an AND operation on the inverted first signal and the second signal to generate the first detection signal, and
wherein the second detector circuit further comprises:
a second AND circuit configured to perform the AND operation on the first signal and the inverted second signal to generate the second detection signal.

6. The delay locked loop circuit of claim 5, wherein the third detector circuit comprises:
a third flip-flop configured to latch and output the first divided clock signal in response to the feedback clock signal;
a fourth flip-flop configured to latch an output signal of the third flip-flop to generate a third signal in response to the feedback clock signal;
a first NOR gate configured to perform a NOR operation on the first detection signal and the third signal to generate a fourth signal;
a second NOR gate configured to perform a NOR operation on the second detection signal and the fourth signal to generate the first selection signal; and
an inverter configured to invert the first selection signal to generate the second selection signal.

7. The delay locked loop circuit of claim 1, further comprising:
a duty cycle corrector circuit configured to correct a duty ratio of an input clock signal to generate a duty corrected clock signal in response to a duty detection signal;
a phase splitter circuit configured to split a phase of the duty corrected clock signal to generate a first splitted clock signal which is the first internally generated clock signal and a second splitted clock signal which is the second internally generated clock signal; and
a duty cycle detector circuit configured to detect the duty ratio of the input clock signal using the first splitted clock signal and the second splitted clock signal to generate the duty detection signal.

8. The delay locked loop circuit of claim 7, wherein the selection signal generator circuit comprises:
a first detector circuit configured to activate a first detection signal in response to the first edge of the feedback clock signal being present within the first period;
a second detector circuit configured to activate a second detection signal in response to the first edge of the feedback signal being present within the second period; and
a third detector circuit configured to activate the first selection signal in response to the first edge of the feedback clock signal being present within the first period, or within a third period of a first level of the first splitted clock signal, the third period not including the first period and the second period, and to activate the second selection signal in response to the first edge of the feedback clock signal being present within the second period, or within a fourth period of a second level of the first splitted clock signal, the fourth period not including the first period and the second period.

9. The delay locked loop circuit of claim 8, wherein the first detector circuit and the second detector circuit comprises:
a first delayer circuit configured to delay the first splitted clock signal by the third time to generate a first delayed clock signal;
a first flip-flop configured to latch the first delayed clock signal to generate a first signal in response to the feedback clock signal and to generate an inverted first signal in response to the feedback clock signal;
a second delayer circuit configured to delay the feedback clock signal by the third time to generate a second delayed clock signal; and
a second flip-flop configured to latch the first splitted clock signal to generate a second signal and an inverted second signal in response to the second delayed clock signal,
wherein the first detector circuit further comprises:
a first AND circuit configured to perform an AND operation on the inverted first signal and the second signal to generate the first detection signal, and
wherein the second detector circuit further comprises:
a second AND circuit configured to perform the AND operation on the first signal and the inverted second signal to generate the second detection signal.

10. The delay locked loop circuit of claim 9, wherein the third detector circuit comprises:
a third flip-flop configured to latch and output the first splitted clock signal in response to the feedback clock signal;

a fourth flip-flop configured to latch an output signal of the third flip-flop to generate a third signal in response to the feedback clock signal;
a first NOR gate configured to perform a NOR operation on the first detection signal and the third signal to generate a fourth signal;
a second NOR gate configured to perform a NOR operation on the second detection signal and the fourth signal to generate the first selection signal; and
an inverter configured to invert the first selection signal to generate the second selection signal.

11. A delay locked loop circuit comprising:
a divider circuit configured to divide an input clock signal to generate a first divided clock signal, to generate a second divided clock signal having an inverted phase of the first divided clock signal, to generate a third divided clock signal having 90-degree phase difference with the first divided clock signal, and to generate a fourth divided clock signal having an inverted phase of the third divided clock signal;
a first selector circuit configured to generate the first divided clock signal as a first reference clock signal in response to a first selection signal, and to generate the second divided clock signal as the first reference clock signal in response to a second selection signal;
a second selector circuit configured to generate the third divided clock signal as a second reference clock signal in response to the first selection signal, and to generate the fourth divided clock signal as the second reference clock signal in response to the second selection signal;
a first delay circuit configured to delay the first reference clock signal by a first time according to a code value to generate a first clock signal;
a second delay circuit configured to delay the first divided clock signal by the first time according to the code value to generate a second clock signal;
a third delay circuit configured to delay the second reference clock signal by the first time according to the code value to generate a third clock signal;
a clock signal delay path circuit configured to delay the first clock signal and the third clock signal by a second time to generate an output clock signal;
a clock signal delay replica circuit configured to delay the second clock signal by the second time to generate a feedback clock signal;
a selection signal generator circuit configured to activate the first selection signal in response to a first edge of the feedback clock signal being present within a first period including a third time before and after the first edge of the first divided clock signal, and to activate the second selection signal in response to the first edge of the feedback clock signal being present within a second period including the third time before and after a second edge of the first divided clock signal;
a first phase detector circuit configured to detect a phase difference between the first divided clock signal and the feedback clock signal to generate a first phase difference detection signal in response to the first selection signal being activated;
a second phase detector circuit configured to detect a phase difference between the second divided clock signal and the feedback clock signal to generate a second phase difference detection signal in response to the second selection signal being activated; and
a delay control circuit configured to change the code value in response the first phase difference detection signal or the second phase difference detection signal.

12. The delay locked loop circuit of claim 11, wherein the selection signal generator circuit comprises:
a first detector circuit configured to activate a first detection signal in response to the first edge of the feedback clock signal being present within the first period;
a second detector circuit configured to activate a second detection signal in response to the first edge of the feedback clock signal being present within the second period; and
a third detector circuit configured to activate the first selection signal in response to the first edge of the feedback clock being is present within the first period, or within a third period of a first level of the first divided clock signal except for the first period and the second period, and to activate the second selection signal in response to the first edge of the feedback clock signal being present within the second period, or within a fourth period of a second level of the first divided clock signal except for the first period and the second period.

13. A semiconductor memory device comprising:
a clock signal input buffer circuit configured to buffer and delay an external clock signal by a fourth time to generate an input clock signal;
a delay locked loop circuit configured to (a) generate a first clock signal by delaying a first internally generated clock signal obtained by dividing or splitting the input clock signal by a first time according to a code value, in response to a first selection signal, and by delaying a second internally generated clock signal obtained by dividing or splitting the input clock signal by the first time according to the code value, in response to a second selection signal, (b) generate a data strobe signal by delaying the first internally generated clock signal by a second time, (c) generate a second clock signal by delaying the first internally generated clock signal by the first time according to the code value, and (d) generate a feedback clock signal locked to the first internally generated clock signal by delaying the second clock signal by an amount corresponding to the fourth time+the second time;
a row decoder circuit configured to decode a row address to generate a plurality of word line selection signals;
a column decoder circuit configured to decode a column address to generate a plurality of column selection signals;
a memory cell array including a plurality of memory cells, and configured to output data stored in memory cells selected from the plurality of memory cells by the plurality of word line selection signals and the plurality of column selection signals;
a data read path circuit configured to input the data output from the memory cell array in response to a read command and a latency signal, and to generate the data in response to the first clock signal; and
a data output buffer circuit configured to buffer the data to output buffered data to the outside.

14. The semiconductor memory device of claim 13, wherein the delay locked loop circuit comprises:
a first selector circuit configured to generate the first internally generated clock signal as a first reference clock signal in response to the first selection signal, and to generate the second internally generated clock signal as the first reference clock signal in response to the second selection signal;

a first delay circuit configured to delay the first reference clock signal by the first time according to the code value to generate the first clock signal;

a second delay circuit configured to delay the first internally generated clock signal according to the code value by the first time to generate the second clock signal;

a clock signal delay path circuit configured to generate a data strobe clock signal using the first clock signal as the data strobe signal, and to delay the first clock signal by the second time to generate the data strobe signal;

a clock signal delay replica circuit configured to delay the second clock signal by an amount corresponding to the fourth time + the second time to generate the feedback clock signal;

a selection signal generator circuit configured to activate the first selection signal in response to a first edge of the feedback clock signal being present within a first period including a third time before and after the first edge of the first internally generated clock signal, and to activate the second selection signal in response to the first edge of the feedback clock signal being present within a second period including the third time before and after a second edge of the first internally generated clock signal; and a phase detection and delay control circuit configured to detect a phase difference between the first internally generated clock signal and the feedback clock signal to generate a first phase difference detection signal in response to the first selection signal being activated, to detect a phase difference between the second internally generated clock signal and the feedback clock signal to generate a second phase difference detection signal in response to the second selection signal being activated, and change the code value in response the first phase difference detection signal or the second phase difference detection signal.

15. The semiconductor memory device of claim 14, further comprising:

a mode setting register circuit configured to input a mode setting code applied from the outside to set a read latency and a burst length in response to a mode setting command; and a latency control circuit configured to generate the latency signal using the first clock signal, the read latency, and the burst length in response to the read command and the first selection signal being activated, and delay the latency signal by one clock cycle of the input clock signal to generate the latency signal in response to the read command and the second selection signal being activated.

16. The semiconductor memory device of claim 15, wherein the delay locked loop circuit further comprises:

a divider circuit configured to divide the input clock signal to generate the first divided clock signal which is the first internally generated clock signal and the second divided clock signal which has an inverted phase of the first divided clock signal and is the second internally generated clock signal, wherein the selection signal generator circuit comprises:

a first detector circuit configured to activate a first detection signal in response to the first edge of the feedback clock signal being present within the first period;

a second detector circuit configured to activate a second detection signal in response to the second edge of the feedback clock signal being present within the second period; and a third detector circuit configured to activate the first selection signal in response to the first edge of the feedback clock signal being present within the first period, or within a third period of a first level of the first divided clock signal except for the first period and the second period, and to activate the second selection signal in response to the first edge of the feedback clock signal being present within the second period, or within a fourth period of a second level of the first divided clock signal except for the first period and the second period.

17. The semiconductor memory device of claim 16, wherein the divider circuit is configured to divide the input clock signal to further generate a third divided clock signal having 90-degree phase difference with the first divided clock signal and to generate a fourth divided clock signal having an inverted phase of the third divided clock signal, and wherein the delay locked loop circuit further comprises:

a second selector circuit configured to generate the third divided clock signal as a second reference clock signal in response to the first selection signal, and to generate the fourth divided clock signal as the second reference clock signal in response to the second selection signal; and a third delay circuit configured to delay the second reference clock signal by the first time to generate a third clock signal.

18. The semiconductor memory device of claim 17, wherein the first detector circuit and the second detector circuit comprise:

a first delayer circuit configured to delay the first divided clock signal by the third time to generate a first delayed clock signal;

a first flip-flop configured to latch the first delayed clock signal to generate a first signal and an inverted first signal in response to the feedback clock signal;

a second delayer circuit configured to delay the feedback clock signal by the third time to generate a second delayed clock signal; and a second flip-flop configured to latch the first divided clock signal to generate a second signal and an inverted second signal in response to the second delayed clock signal, wherein the first detector circuit further comprises:

a first AND circuit configured to perform an AND operation on the inverted first signal and the second signal to generate the first detection signal, wherein the second detector circuit further comprises:

a second AND circuit configured to perform the AND operation on the first signal and the inverted second signal to generate the second detection signal, and wherein the third detector circuit comprises:

a third flip-flop configured to latch and output the first divided clock signal in response to the feedback clock signal;

a fourth flip-flop configured to latch an output signal of the third flip-flop to generate a third signal in response to the feedback clock signal;

a first NOR gate configured to perform a NOR operation on the first detection signal and the third signal to generate a fourth signal;

a second NOR gate configured to perform the NOR operation on the second detection signal and the fourth signal to generate the first selection signal; and an inverter configured to invert the first selection signal to generate the second selection signal.

19. The semiconductor memory device of claim 15, wherein the delay locked loop circuit comprises:

a duty cycle corrector circuit configured to correct a duty ratio of an input clock signal to generate a duty corrected clock signal in response to a duty detection signal;

a phase splitter circuit configured to split a phase of the duty corrected clock signal to generate a first splitted clock signal which is the first internally generated clock signal and a second splitted clock signal which is the second internally generated clock signal; and a duty cycle detector circuit configured to detect the duty ratio of the input clock signal using the first splitted clock signal and the second splitted clock signal to generate the duty detection signal.

20. The semiconductor memory device of claim 19, wherein the selection signal generator circuit comprises:

a first detector circuit configured to activate a first detection signal in response to the first edge of the feedback clock signal being present within the first period;

a second detector circuit configured to activate a second detection signal in response to the first edge of the feedback clock signal being present within the second period; and a third detector circuit configured to activate the first selection signal in response to the first edge of the feedback clock signal being present within the first period, or within a third period including a first level of the first splitted clock signal except for the first period and the second period, and to activate the second selection signal in response to the first edge of the feedback clock signal being present within the second period, or within a fourth period including a second level of the first splitted clock signal except for the first period and the second period.

* * * * *